United States Patent [19]

Chang et al.

[11] Patent Number: 4,823,299

[45] Date of Patent: Apr. 18, 1989

[54] SYSTOLIC VLSI ARRAY FOR IMPLEMENTING THE KALMAN FILTER ALGORITHM

[75] Inventors: Jaw J. Chang, Arcadia; Hen-Geul Yeh, Lomita, both of Calif.

[73] Assignee: The United States of America as represented by the Administrator of the National Aeronautics and Space Administration, Washington, D.C.

[21] Appl. No.: 32,819

[22] Filed: Apr. 1, 1987

[51] Int. Cl.⁴ .......................... G06F 7/38; G06F 7/52
[52] U.S. Cl. ................................ 364/735; 364/754; 364/724.01; 364/724.05
[58] Field of Search ........ 364/736, 735, 200 MS File, 364/724, 754, 715, 728

[56] References Cited

U.S. PATENT DOCUMENTS

| | | | |
|---|---|---|---|
| 4,310,892 | 1/1982 | Himmler | 364/724 |
| 4,493,048 | 1/1985 | Kung et al. | 364/754 |
| 4,727,503 | 2/1988 | McWhirter | 364/754 |

OTHER PUBLICATIONS

Yeh, "A Design Method for Failure-Proof Systems", Proceedings of the 1983 American Control Conference, San Francisco, CA, Jun. 1983, pp. 1219-1221.
Kung et al., "VLSI and Modern Signal Processing", Prentice Hall, Inc., Englewood Cliffs, N.J, 1985, pp. 375-388.
Yeh et al., "VLSI Design of Number-Theoretic Transforms for a Fast Convolution", Proceedings of the 1983 IEEE International Conference on Computer Design: VLSI in Computers; Port Chester, N.Y., Oct. 31-Nov. 3, 1983, pp. 200-203.
Chang et al., "The VLSI Design of a Single Chip for the Multiplication of Integers Modulo a Fermat Number", IEEE Trans. on ASSP, vol. ASSP-33, No. 6, Dec. 1985, pp. 1599-1602.
J. V. McCanny et al., Bit-Level Systolic Array Circuit for Matrix Vector Multiplication, IEEE Proceedings, vol. 130, No. 4, Aug. 1983, pp. 125-130.

Primary Examiner—Gary V. Harkcom
Assistant Examiner—Long Thtul/ Nguyen
Attorney, Agent, or Firm—Thomas H. Jones; John R. Manning; Paul F. McCaul

[57] ABSTRACT

A method and apparatus for processing signals representative of a complex matrix/vector equation. More particularly, signals representing an orderly sequence of the combined matrix and vector equation, known as a Kalman filter algorithm, are processed in real time in accordance with the principles of this invention. The Kalman filter algorithm is rearranged into a Faddeeva algorithm, which is a matrix-only algorithm that is modified to represent both the matrix and vector portions of the Kalman filter algorithm. The modified Faddeeva algorithm is embodied into electrical signals which are applied as inputs to a systolic array processor. The processor performs triangulation and nullification on the input signals, and delivers an output signal which is a real-time solution to the input signals.

13 Claims, 4 Drawing Sheets

DATA FLOW AND CELL ARRANGEMENT:
triangularization process
n = 4 annulling process, n = 4

Zero padding scheme for implementing a small-size matrix / vector on a processor array.

Computer simulation on the numerical computation of a Kalman filter: 4(a) $K_{11}(k)$ vs time k
4(b) $P_{11}(k/k-1)$ vs time k
4(c) $P_{33}(k/k-1)$ vs time k

SYSTOLIC VLSI ARRAY FOR IMPLEMENTING THE KALMAN FILTER ALGORITHM

ORIGIN OF THE INVENTION

The invention described herein was made in the performance of work under a NASA Contract, and is subject to the provisions of Public Law 96-517 (35 USC 202) in which the contractor has elected not to retain title.

Of the inventors, Mr. Yeh is now at California State University, Long Beach, and Mr. Chang is at Jet Propulsion Laboratory. The inventor, Mr. Yeh, is an author of a paper describing aspects of the invention and entitled "Systolic VLSI For Kalman Filters," Proceedings of IEEE International Conference on ASSP, April, 1986.

BACKGROUND OF THE INVENTION

1. Field of the Invention

This invention relates to real-time signal processing and more particularly relates to real-time processing of signals representing the complex Kalman filter algorithm.

2. Brief Description of the Prior Art

For years, the Kalman filter has been applied extensively in many signal processing applications, including target tracking, adaptive controls, radar-signal processing, and failure-proof systems. See, for example (1) A. Gebb, *Applied Optimal Estimation*, The M.I.T. Press, Cambridge, Mass., 1974; (2) J. S. Meditch, *Stochastic Optimal Linear Estimation and Control*, McGraw-Hill, New York, 1969; (3) H. G. Yeh, "A Design Method for Failure-Proof Systems," Proceedings of the 1983 American Control Conference, San Francisco, Calif., June, 1983, pp. 1219–1223; or (4) H. G. Yeh, *Techniques for the Detection, Estimation, Distinction, and Compensation of Failures in Linear Systems*, Ph.D. Dissertation, U. C. Irvine, 1982. The applicability of the Kalman filter to real-time signal processing problems is in general limited by the relatively complex mathematical operations necessary in computing the Kalman filtering algorithm. See, for example: (1) H. W. Sorenson, *Parameter Estimation*, Marcel Dekker, New York, 1980; or (2) A. E. Bryson and Y. C. Ho, *Applied Optimal Control*, Rev. ed., Halsted Press, Div. of John Wiley & Sons, Waltham, Mass., 1975. The rapid development of VLSI integrated circuits has been reported. See, for example: (1) C. S. Yeh, I. S. Reed, J. J. Chang, and T. K. Truong, "VLSI Design of Number Theoretic Transforms for a Fast Convolution," Proceedings of the 1983 IEEE International Conference on Computer Design: VLSI in Computers, Port Chester, N.Y., Oct. 31–Nov. 3, 1983, pp. 202–203; (2) J. J. Chang, T. K. Truong, H. M. Shao, I. S. Reed, and I. S. Hsu, "The VLSI Design of a Single Chip for the Multiplication of Integers Modulo a Fermat Number," *IEEE Trans. on ASSP*, Vol. ASSP-33, No. 6, December 1985, pp. 1599–1602; or (3) S. Y. Kung, H. J. Whitehouse, and T. Kailath, *VLSI and Modern Signal Processing*, Prentice-Hall, Inc., Englewood Cliffs, N.J., 1985, pp. 375–388.

The VLSI development, together with the features of this invention, has made it technologically feasible to implement more complex mathematical relationships, such as the Kalman filter algorithm in real time. A novel method and apparatus for the implementation of this invention does not rely upon the prior art computers for storage, manipulation and nonreal-time solution of the Kalman filter algorithm.

SUMMARY OF THE INVENTION

A method and apparatus for processing signals representative of a complex matrix/vector equation is disclosued and claimed. More particularly, signals representing an orderly sequence of the combined matrix and vector equation, known as a Kalman filter algorithm, is processed in real time in accordance with the principles of this invention. The Kalman filter algorithm is rearranged into a Faddeeva algorithm, which is a matrix only algorithm that we have modified to represent both the matrix and vector portions of the Kalman filter algorithm. Our modified Faddeeva algorithm, in a typical non-limiting example, which has four-quadrant matrices, with one four-by-four matrix in each of the quadrants. Electrical signals representing each of the time-varying elements in the matrix are applied as inputs to a systolic array processor. The processor is characterized by an array of row and internal cell elements which cyclically performs triangulation and nullification on the input signals. At certain cycles, an intermediate output term from the array is temporarily stored and is reintroduced as an input term to the array at the appropriate time. Following a complete cycle of triangulation and nullification, a final output signal is delivered from the systolic processing array which output signal is a real-time solution to the input signals which represented the represented the Kalman filter algorithm.

BRIEF DESCRIPTION OF THE DRAWING

FIG. 1 includes FIG. 1a which depicts a triangularization process for two four-by-four matrices, and FIG. 1b which depicts an annulling process for four-by-four matrices;

DETAILED DESCRIPTION OF THE DRAWING

Figure 1A:
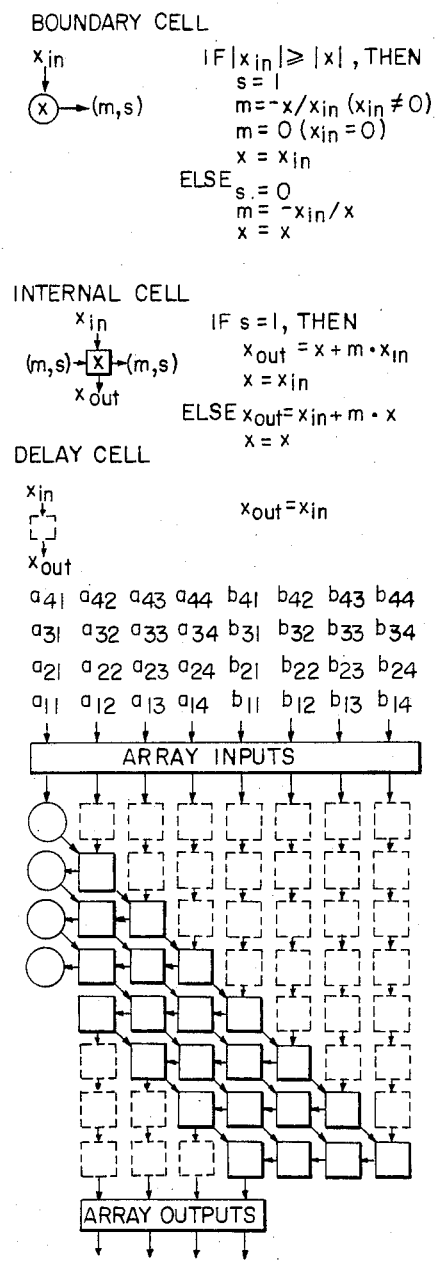
FIG. 1 depicts a block diagram of a pair of systolic arrays in accordance with the principles of this invention.
Figure 1B:
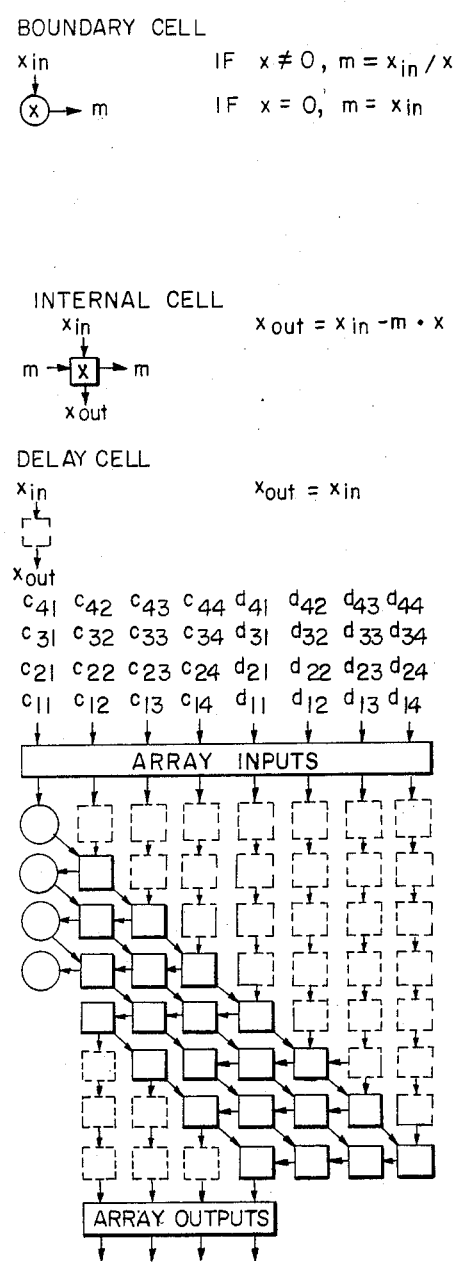

FIG. 1, including FIGS. 1a and 1b, depicts a pair of two-dimensional systolic arrays useful for achieving output signals which represent the real-time solution of a Kalman filter algorithm. The input signals into each array of the pair are as defined in the legend of the figure and the make up of the individual cells are as set forth in the appropriate legends of FIG. 1.

A pair of arrays are shown and described in FIG. 1 to promote an easier understanding of the invention. However, in operation, only one array 500 has the two functions shown in the legends of FIG. 1a and 1b acting as two modes of operation for both the boundary and internal cells. A commonly connected control line 505 selects the appropriate mode.

Figure 5:
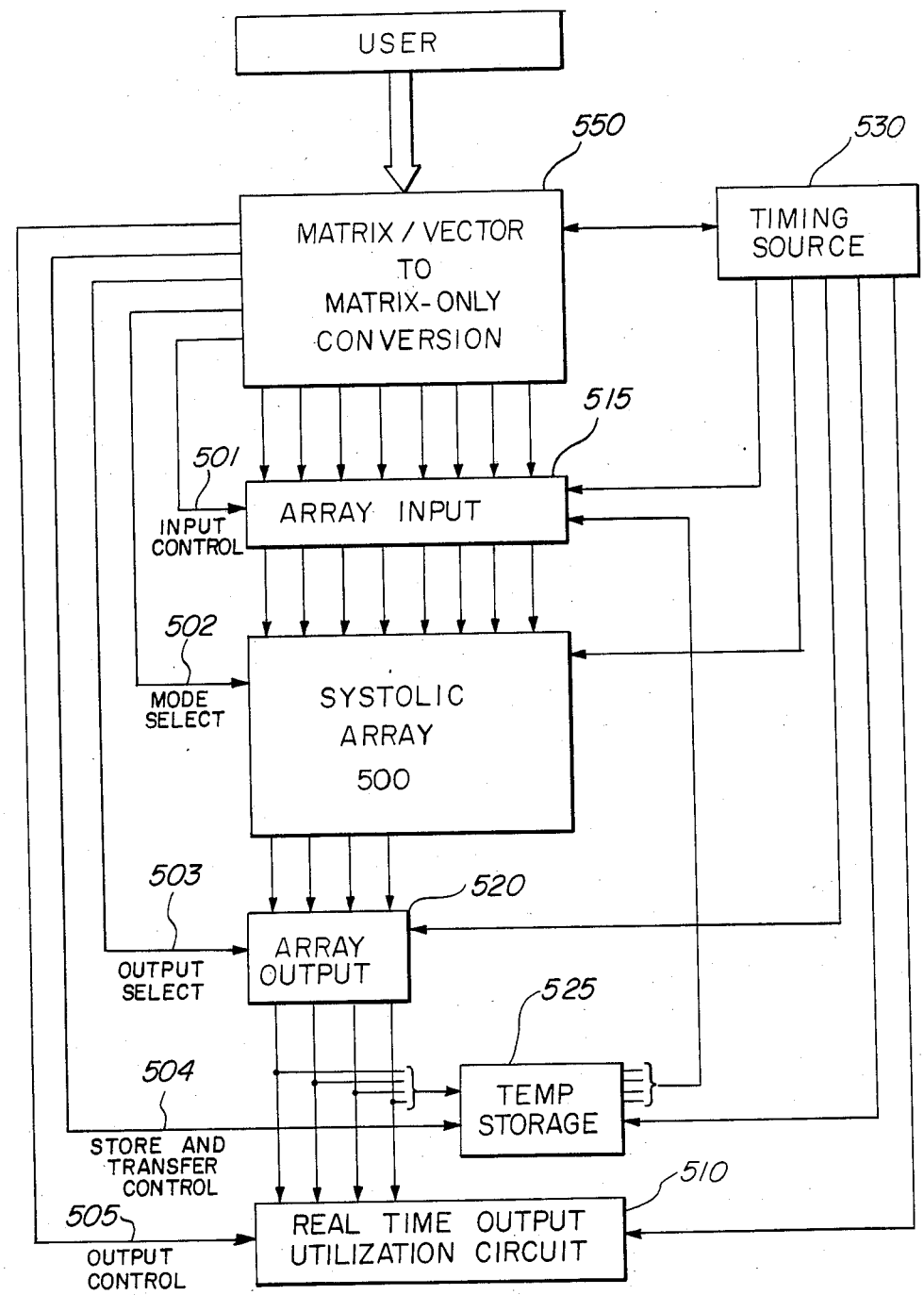
FIG. 5 is a simplified block diagram of a system in accordance with the invention.

In FIG. 5, timing is provided by source 530. A Kalman-type algorithm is converted to a Faddeeva-type matrix only algorithm by timing any suitable converter 550 such as a properly programmed computer. In our preferred embodiment, eight matrix input terms at array input 515 are translated by array 500 to four matrix output terms at output 520. On certain cyclical passes during the array's processing, the array output is stored in temporary storage 525 and is then used at appropriate times as an input signal at the array input 515. The conversion timing and controls for FIG. 5 are all well within the oridinary skill of those in the related art when read in light of the more detailed decription in this specification.

In order to fully appreciate the strength and power that this invention is capable of achieving, it is believed helpful to digress briefly with a description of some of the fundamentals which underlie the key features of this invention.

1. General Principles

The processing of the Kalman filter requires matrix/vector operations such as multiplication, addition, subtraction, and inversion. As noted earlier, such operations have previously been performed by storage and nonreal-time processing in computers. We take advantage of our observation that matrix inversion is the most difficult to implement in terms of speed and accuracy. The Faddeeva algorithm has been suggested as a universal algorithm for various matrix manipulations due to the fact that it is easily systematized for matrix calculations and maps easily into a concurrent systolic array architecture. See, for example: (1) J. G. Nash and S. Hansen, "Modified Faddeeva Algorithm for Matrix Manipulation," *Proceedings of the 1984 SPIE Conference,* San Diego, Calif., August, 1984, pp. 39–46; or (2) J. G. Nash and C. Petrozolin, "VLSI Implementation of a Linear Systolic Array," Proceedings of ICASSP, 1985, Tampa, Fla., March 26–29, 1985, pp. 1392–1395. In this invention, we have arranged Kalman filter algorithms into a form of Faddeeva algorithm in order to maximize the capability of hardware implementation of systolic arrays. Such a rearrangement provides several beneficial results. First of all, the proposed Faddeeva algorithm avoids the direct matrix inverse computations as the usual back substitution in the Kalman filter implementation and obtains the values of the desired results at the end of the forward course of computation. Feedback of computational signals, inherent in the inverse matrix computations in the Kalman filter algorithm, is thus avoided. Remapping, or rearranging, in this manner results in a considerable saving in added processing and storage. Secondly, since the Gaussian elimination procedure of this invention is applied through the forward course of computation, numerical stability is obtained and the design is simplified. Thirdly, the parallel, modular computer architecture which consists of systolic processors provides simultaneous high throughput and a capability for a wide variety of linear algebraic operations.

The following sections discuss, in order, a Kalman filter algorithm, the Faddeeva algorithm, the implementation of a two-dimensional systolic array architecture, and a numerical example which exemplifies our invention.

2. Kalman Filter

Kalman filters have been shown to be the optimal linear estimator in the least square sense for estimating dynamic system states in linear systems. The Kalman filter updates state estimation based on prior estimates and observed measurements. It consists of the model of the dynamic process which performs the function of prediction and a feedback correction scheme. The measurements can be processed as they occur, and there is no need to store any measurement data. However, all the associated matrices which describe the system dynamic, measurement system, and noise is assumed to be known. The conventional discrete time-varying Kalman filtering process involves the propagation of state estimates and error covariance matrices from time sample to next time sample.

The following equations define a general dynamic system and a measurement system.

$$x(k+1) = \phi(k) \times (k) + w(k) \qquad (1)$$

$$z(k) = H(k) \times (k) + v(k) \qquad (2)$$

In Equation (1), $\phi(k)$ is an $n \times n$ matrix called the state transition matrix which describes the system or plant, $x(k)$ is the state vector with n-dimensions, and $w(k)$ is a n-vector called the disturbance. In Equation (2), $z(k)$ is a m-vector termed the measurement vector; $v(k)$ is also a m-vector called the measurement noise vector, and $H(k)$ is a $m \times n$ matrix called the measurement matrix. The disturbance $w(k)$ and noise $v(k)$ are assumed to be zero-mean Gaussian white noise sequences with covariance matrices $Q(k)$ and $R(k)$, respectively. Furthermore, sequences $w(k)$ and $v(k)$ are assumed to be statistically independent. The Kalman filter is described by the following equations under assumptions that matrices $\phi(k)$, $H(k)$, $R(k)$, and $Q(k)$ are known.

$$\hat{x}(k/k-1) = \phi(k-1)\hat{x}(k-1/k-1) \qquad (3)$$

$$P(k/k-1) = \phi(k-1)P(k-1)\phi^T(k-1) + Q(k-1) \qquad (4)$$

$$P^{-1}(k/k) = P^{-1}(k/k-1) + H^T(k)R^{-1}(k)H(k) \qquad (5)$$

$$K(k) = P(k/k)H^T(k)R^{-1}(k) \qquad (6)$$

$$\Delta z(k) = z(k) - H(k)\hat{x}(k/k-1) \qquad (7)$$

$$\hat{x}(k/k) = \hat{x}(k/k-1) + K(k)\Delta z(k) \qquad (8)$$

$$k = 1, 2, \ldots$$

Initial conditions are given as follows:

$$x(0/0) = 0 \qquad (9)$$

$$P(0/0) = P(0) \text{ or } P^{-1}(0/0) = P^{-1}(0) \qquad (10)$$

Note that matrices $P(k/k)$ and $P(k-1/k)$ are commonly called error covariance matrices. The vector $\hat{x}(k/k)$ represents the optimal estimate of $x(k)$ based on the measurement sequence $\{z(1), z(2), z(3), \ldots, z(k)\}$. Equations (3) and (4) are referred to as time updates and Equations (5), (6), and (8) are referred to as measurement updates and Equation (7) is the residual sequence. These filter equations are computed in order as listed from Equations (3) to (8) in order to solve the Kalman filter algorithm.

3. Faddeeva Algorithm

Consider a linear equation:

$$AX = B \qquad (11)$$

Suppose that it is desired to find CS+D, a linear combination of X without first finding X, which is an unknown. This can be presented in matrix form as:

$$\begin{array}{c|c} A & B \\ \hline -C & D \end{array} \quad (12)$$

where A, B, C, and D are matrices or vectors. The dimension of the matrices will be discussed later. By adding suitable combinations of A and B to $-C$ and D, the term "$-C+WA$" appears in the lower left hand quadrant and "$D+WB$" in the bottom right hand quadrant. It shows in matrix form as:

$$\begin{array}{c|c} A & B \\ \hline -C+WA & D+WB \end{array} \quad (13)$$

If W specifies the appropriate linear combination such that the lower left hand side of Equation (13) is zero, then CX+D will appear on the lower right hand side. That is, $$W = CA^{-1} \quad (14)$$

$$D + WB = D + CA^{-1}B \quad (15)$$

$$= CX + D$$

Representing the above equation in matrix form, we obtain:

$$\begin{array}{c|c} A & B \\ \hline 0 & CX+D \end{array} \quad (16)$$

Note that CX+D is the desired result and appears in the bottom right hand quadrant after the process to annul the bottom left hand quadrant.

This property allows us to provide two four-element input terms to a two-dimensional array and obtain one four-element output, the desired result, from the array. The lower left hand quadrant is a zero array which is obtained during the passes through the array as will be described later. Since it is zero, no output signal is required. The remainder is our desired result and it can either be used directly in real time by circuit 510 via array output 525 (FIG. 5) or stored in temporary storage 525 (FIG. 5), as appropriate.

Figures 2, 3:
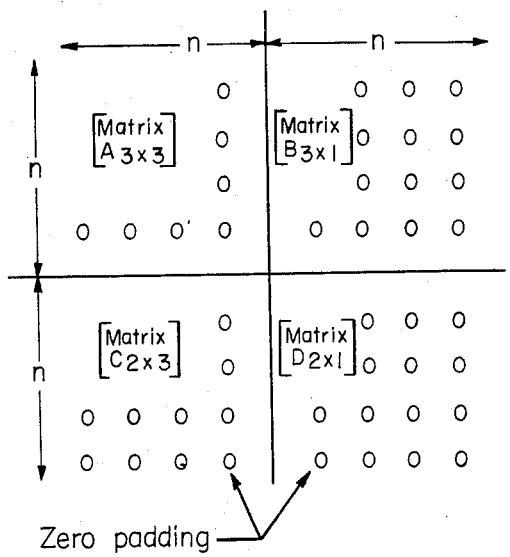
FIG. 2 depicts examples of a variety of matrix operations of the Faddeeva algorithm.
FIG. 3 depicts a zero padding technique useful in performing the method and apparatus of this invention.

It is clear from the above illustration that given matrices A, B, C and D, $CA^{-1}B+D$ can be computed. Consequently, by proper selection of matrices A, B, C, and D, the capability of the Faddeeva algorithm can be fully utilized. The various possible matrix manipulations are shown in FIG. 2.

The simplicity of the algorithm is due to the absence of a necessity to actually identify the multipliers of the rows of A and the elements of B; it is only necessary to "annul the last row." This can be done by triangularization, a numerically stable procedure, combined with an equally stable Gaussian elimination procedure. See, for example: (1) H. T. Kung, R. Sproull, and G. Steele, *VLSI Systems and Computations*, Computer Science Press, Carnegie-Mellon University, Pa., October, 1981, pp. 367-378; or (2) W. M. Gentleman and H. T. Kung, "Matrix Triangularization by Systolic Arrays," *SPIE Real-Time Signal Processing IV*, San Diego, Calif., August, 1981, Vol. 298, pp. 19-26.

4. Implementation

A Kalman filter algorithm having Equations (3) through (8) are adjusted to be the type of Faddeeva algorithm. In this connection, see (H. G. Yeh, "Kalman Filtering and Systolic Processors," Proceedings of the IEEE International Conf. on Acoustic, Speech, and Signal Processing, Tokyo, Japan, April, 1986, pp. 2139-2142). In our implementation, computations are cyclically propagated through the systolic array of FIG. 1 in accordance with the ordered set of passes disclosed hereafter. Note that new data is shifted into the array of FIG. 1 from the top, row by row as the calculation proceeds, so that there is no delay in starting the next matrix computation. Each Kalman filter algorithm requires all eight passes of the Faddeeva algorithm. Whereas the Kalman filter algorithm has five equations, one of those equations is sufficiently complex so that it requires several passes of the Faddeeva algorithm. Equation (5) thus requires three passes, namely the third, fourth and fifth passes. The passes for a Faddeeva-type algorithm employed in accordance with our invention are as follows:

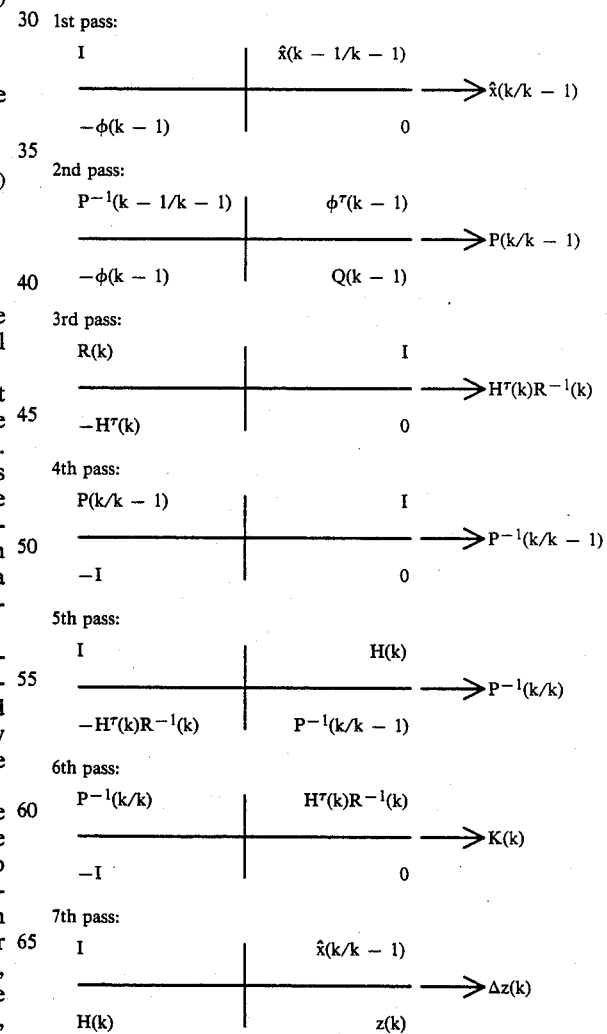

8th pass:

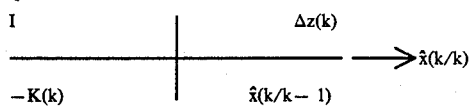

Note that the results (lower right quadrant) of each pass in general needs to be temporarily stored and is used in later passes as new entries. For example, note that the output from the first pass is used as an entry for the seventh pass, as is shown in the upper right hand quadrant of the seventh pass. The solution of the Kalman filter algorithm is the final output from the array and is shown as the output for the eighth pass. It will thus be understood that conventional timing will be required to select the eighth pass as the final output at the end of every eight passes which constitute one complete cycle for a solution.

5. Architecture

A general architecture is proposed to process all eight passes as mentioned in the previous section. To fit the type of Faddeeva algorithm, the number of columns of the matrix (lower left quadrant) should be less than or equal to the number of columns of the matrix (upper left quadrant). Fortunately, all eight passes meet this requirement so that the matrix (lower left quadrant) will be annulled row by row. This can be done by ordinary Gaussian elimination. However, Gaussian elimination in general requires pivoting, and the pivoting strategy is not suited to a systolic array since it may require global communications for the pivot section. The neighbor pivoting technique introduces a zero to a row by subtracting a multiple of an adjacent row from it, interchanging the two rows when necessary to prevent the multiple from exceeding unity. (See, for example, W. M. Gentleman and H. T. Kung, "Matrix Triangularization by Systolic Arrays," *SPIE Real-Time Signal Processing IV,* San Diego, Calif., August, 1981, Vol. 298, pp. 19–26). The possibility of having an infinity calculation is avoided by using a two step process, as described.

This process is shown in the modified Faddeeva algorithm (a two-step procedure):

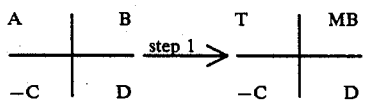

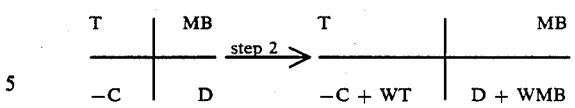

where T is an upper triangular matrix, and M is a nonsingular (triangularization) matrix. Since $W=CT^{-1}$, the final result is $G=D+WMB=D+CA^{-1}B$. In order to triangularize matrix A and to annul matrix C, it is necessary to have a two-step procedure. First, A is triangularized by the neighbor pivoting process (simultaneously applied to B); second, C is annulled by Gaussian elimination using the diagonal elements of T as pivot elements. The square processor arrangement for both the triangularization and annulling steps is shown in FIGS. 1a and 1b, respectively of FIG. 1. See, for example, (1) J. G. Nash and S. Hansen, "Modified Faddeeva Algorithm for Matrix Manipulation," Proceedings of the 1984 SPIE Conference, San Diego, Calif., August, 1984, pp. 39–46. or (2) J. G. Nash and C. Petrozolin, "VLSI Implementation of a Linear Systolic Array," Proceedings of ICASSP, 1985, Tampa, Fla., March 26–29, 1985, pp. 1392-1395 for related information. However, to compute all eight passes, the size of the processor is 2n cells (row) by 2n cells (column), where n is the size of the vector x(n).

It is desirable to have a fixed size processor to handle all eight passes. However, the size of the entry matrix/vector varies from pass to pass. By padding zeros in appropriate places, the 2n cells (row) by 2n (column) become the proper size for implementing Kalman filters. The scheme of zero padding is illustrated in FIG. 3. By using the fixed size $2n \times 2n$ processor arrays, the estimate $\hat{x}(k/k)$ can be updated in each 16n time unit (assuming that it takes one time unit to operate data in a cell).

6. Numerical Example

An example of air-traffic-control radar is chosen for numerical simulation. In this example, a user has range, range rate, bearing, and bearing rate as four components (in order) of the state vector x(k). The maneuver noise, which impacts on the change in range rate and bearing rate, is assumed to be zero-mean white, and the range rate and bearing rate are uncorrelated and with variances of 330 and $1.3 \times 10^{-8}$, respectively. The radar sensors are assumed to provide noisy measurements of the range and bearing. The noise of the radar sensors is assumed to be zero-mean white, and the range rate and bearing rate are uncorrelated and with variances of $10^6$ and $2.89 \times 10^{-4}$, respectively. The values of the matrices and initial values are listed as follows:

$$\phi(k) = \begin{bmatrix} 1 & 15 & 0 & 0 \\ 0 & 1 & 0 & 0 \\ 0 & 0 & 1 & 15 \\ 0 & 0 & 0 & 1 \end{bmatrix}$$

$$H(k) = \begin{bmatrix} 1 & 0 & 0 & 0 \\ 0 & 0 & 1 & 0 \end{bmatrix}$$

-continued $$Q(k) = \begin{bmatrix} 0 & 0 & 0 & 0 \\ 0 & 330 & 0 & 0 \\ 0 & 0 & 0 & 0 \\ 0 & 0 & 0 & 1.3 \times 10^{-8} \end{bmatrix}$$

$$R(k) = \begin{bmatrix} 10^6 & 0 \\ 0 & 2.89 \times 10^{-4} \end{bmatrix}$$

$$P^{-1}(0/0) = \begin{bmatrix} 0.2 \times 10^{-5} & -0.149 \times 10^{-4} & 0 & 0 \\ -0.149 \times 10^{-4} & 0.222 \times 10^{-3} & 0 & 0 \\ 0 & 0 & 0.662 \times 10^4 & -0.483 \times 10^5 \\ 0 & 0 & -0.483 \times 10^5 & 0.738 \times 10^6 \end{bmatrix}$$

$$\hat{x}(0/0) = \begin{bmatrix} 0.200 \times 10^4 \\ 0 \\ 0.500 \\ 0 \end{bmatrix}$$

7. Computer Simulation

Figure 4:
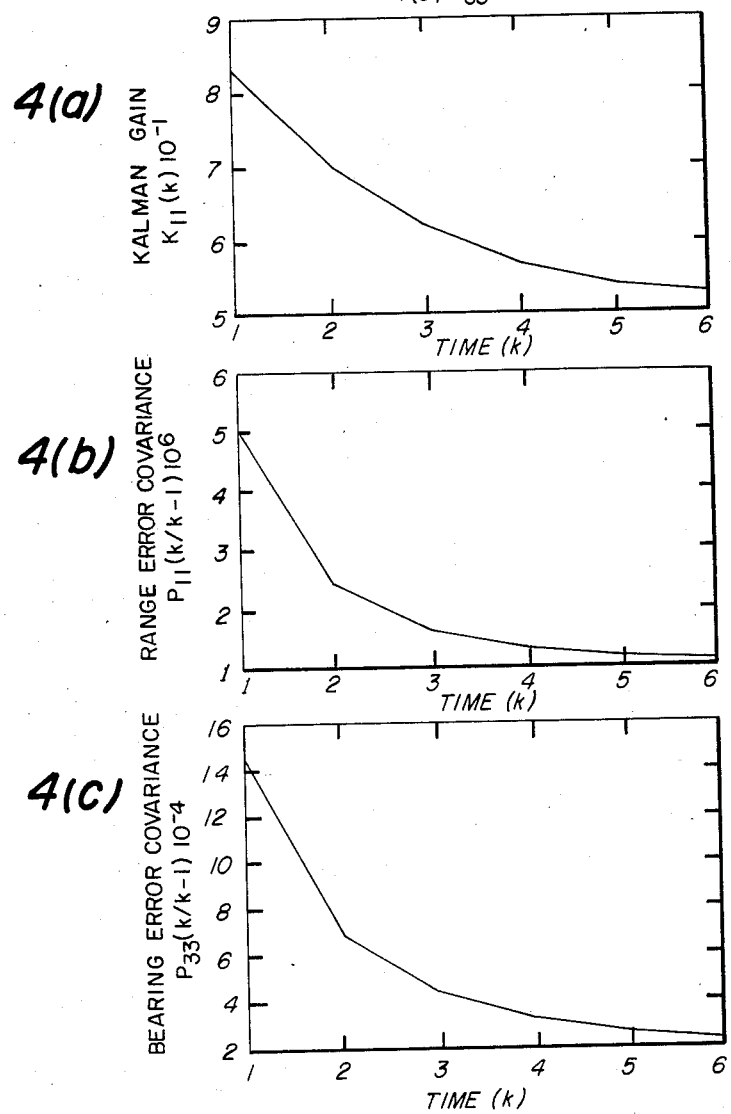
FIGS. 4(a), 4(b), 4(c) depict the results of a computer simulation verifying the real-time capabilities for solution of a Kalman filter algorithm in accordance with this invention.

The above-described example was simultated on a VAX 780. The Kalman gain $K_{11}(k)$, the range error covariance $P_{11}(k/k-1)$, and the bearing error covariance $P_{33}(k/k-1)$ were plotted against time index k and are shown in FIG. 4. These plots show the numerical stability of the implementation of the Kalman filter on the concurrent systolic arrays.

8. Conclusion

The invention's method and architecture computes, in real time, a Kalman filter algorithm which in the prior art has always taken so long that a real-time presentation has not previously been obtained.

The above description presents the best mode contemplated in carrying out our invention. Our invention is, however, susceptible to modifications and alternate constructions from the embodiments shown in the drawings and described above. Consequently, it is not the intention to limit the invention to the particular embodiments disclosed. On the contrary, the invention is intended and shall cover all modifications, sizes and alternate constructions falling within the spirit and scope of the invention, as expressed in the appended claims when read in light of the description and drawings.

What is claimed is:

1. A method of solving equations having both matrix and vector terms in real time, said methiod comprising the steps of:
    mapping a first equation, having both matrix and vector terms, into an equivalent equation which contains matrix-only values that represent both the matrix and vector terms of said first equation;
    applying electrical signals representing the matrix-only values of the equivalent equation to a systolic processing array; and
    generating in the systolic array a real-time solution to said first equation.

2. A method in accordance with claim 1 wherein the equations having matrix and vector terms are characterized as a Kalman filter algorithm and wherein the mapping step is further comprised by the step of:
    converting every complex matrix and vector term of the Kalman filter algorithm into a matrix-only value for application to said systolic array.

3. A method in accordance with claim 2 wherein the Kalman filter algorithm includes several known equations, at least one which is not directly convertible into a systolic array form, and said converting step is further characterized by the additional steps of:
    dividing said one known equation into portions; and
    representing each portion by an equivalent matrix-only value of a size suitable for processing by said systolic array.

4. A method in accordance with claim 3 and comprising the additional step of:
    passing each matrix-only value through said systolic array in order to compute one final output term for said Kalman filter algorithm.

5. A method in accordance with claim 4 wherein said Kalman filter algorithm includes a fixed number of equations and wherein the representation thereof as a Faddeeva algorithm represents a fixed number of matrix-only values; and said passing step further comprises;
    temporarily storing output signals from the systolic array which are needed in other computations in said systolic array;
    inputting the temporarily stored output signals at appropriate times into said systolic array; and
    cyclically passing each of said matrix-only values through said systolic array.

6. A method in accordance with claim 5 wherein said fixed number of matrix-only values comprises a fixed number of passes through said systolic array and wherein said passes further comprise in order the following passes:

1st pass:

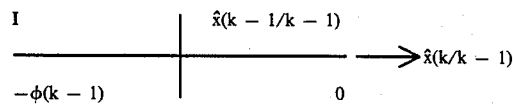

-continued

2nd pass:
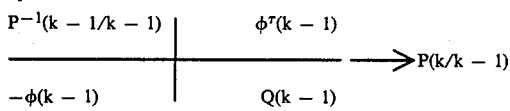

3rd pass:
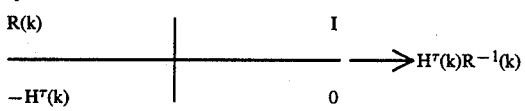

4th pass:
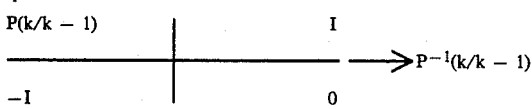

5th pass:
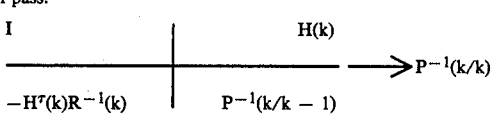

6th pass:
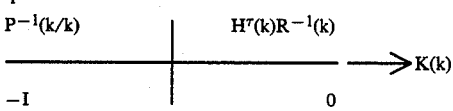

7th pass:
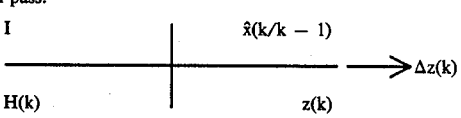

8th pass:
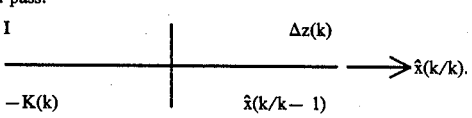

7. A method of solving equations having matrix and vector terms in real time, said method comprising the steps of:

mapping a first equation, having both matrix and vector terms, into an equivalent equation which is represented in matrix-only values that represent the matrix and vector terms of said first equation;

applying signals representing the matrix-only values of the equivalent equation to a systolic processing array; and triangulating and nullifying the signals in said systolic processing array whereby a real time solution to the matrix and vector terms of said first equation appears as an output signal from said systolic processing array.

8. A method of implementing a Kalman filter algorithm for a real-time solution, said method comprising the steps of:

arranging the vector and matrix terms of said Kalman filter algorithm into matrix-only terms of a Faddeeva algorithm, which matrix-only terms represent both the matrix and vector terms of the Kalman filter algorithm;

representing the terms of the Faddeeva algorithm as electrical signals;

inputting the electrical signals into a systolic processing array; and processing the electrical signals in the systolic processing array to obtain a real-time solution to said Kalman filter algorithm.

9. A method of implementing the Kalman filter algorithm for a real-time solution to variable terms in the algorithm, said method resulting in an implementation of the Kalman filter algorithm and comprising the ordered steps of:

(1) arranging the vector and matrix terms of said Kalman filter algorithm into a Faddeeva algorithm which includes matrix-only terms;

(2) placing cell elements according to the size of the matrix to solve the matrix-only terms of the Faddeeva algorithm in a systolic array;

(3) steering electrical signals, representing the matrix-only terms of the Faddeeva algorithm into cell elements of the systolic array; and (4) obtaining from the array, real-time output signals indicative of a real-time solution to said Kalman filter algorithm.

10. Apparatus for solving equations having a matrix and vector terms in real time, said apparatus comprising:

means for mapping a first equation, having both matrix and vector terms, into an equivalent equation which contains matrix-only values that represent both the matrix and vector terms of said first equation;

a systolic array, with an appropriate number of cell elements according to the size of matrix to provide a real-time solution of said matrix-only values, connected to said mapping means; and means for applying electrical signals representing the matrix-only values to said systolic processing array for solution thereof.

11. Apparatus in accordance with claim 10 wherein said systolic array further comprises:

means for triangulating and nullifying the matrix-only values applied thereto, whereby a real-time solution to the matrix and vector equation appears as an output signal from said systolic array.

12. Apparatus in accordance with claim 11 wherein the size of the matrix and vector terms varies and the largest matrix term in the first equation is a matrix $\phi(k)$, and wherein said systolic array further comprises:

a fixed size of 2n by 2n rows and columns, where n is a positive integer, in said array; and means for padding zeros in the non-used spaces of each matrix-only term which has a size in less than that of $\phi(k)$.

13. Apparatus in accordance with claim 12 and further comprising:

means at the input of said systolic array for receiving 2n electrical signals; and output means for said systolic array for delivering an n-sized output signal.

* * * * *